(12) United States Patent
King et al.

(10) Patent No.: US 6,781,140 B1  
(45) Date of Patent: Aug. 24, 2004

(54) METHOD OF AND MACHINE FOR PATTERN WRITING BY AN ELECTRON BEAM

(75) Inventors: David Martin Platton King, Herts (GB); Barrie James Hughes, Cambridgeshire (GB)

(73) Assignee: Leica Microsystems Lithography Limited, Cambridge (GB)

( * ) Notice: Subject to any disclaimer, the term of this patent is extended or adjusted under 35 U.S.C. 154(b) by 0 days.

(21) Appl. No.: 09/659,087

(22) Filed: Sep. 11, 2000

(Under 37 CFR 1.47)

Related U.S. Application Data

(63) Continuation of application No. 09/463,449, filed as application No. PCT/EP98/04390 on Jul. 15, 1998, now abandoned.

(30) Foreign Application Priority Data

Aug. 1, 1997 (GB) .............................. 9716388

(51) Int. Cl.⁷ .............................................. H01J 37/30
(52) U.S. Cl. .............................. 250/492.22; 250/492.1; 250/492.2; 250/492.21; 250/397; 250/398
(58) Field of Search ........................ 250/492.1, 492.21, 250/492.22, 492.3, 397, 398, 396 R, 396 ML, 492.2

(56) References Cited

U.S. PATENT DOCUMENTS

| | | | | |
|---|---|---|---|---|
| 4,282,437 A | * | 8/1981 | Boie | 250/492 A |
| 4,633,090 A | * | 12/1986 | Hahn | 250/492.2 |
| 4,937,458 A | * | 6/1990 | Fujikura | 250/492.2 |
| 5,391,886 A | * | 2/1995 | Yamada et al. | 250/492.22 |

* cited by examiner

Primary Examiner—John R. Lee  
Assistant Examiner—David A. Vanore  
(74) Attorney, Agent, or Firm—Foley & Lardner

(57) ABSTRACT

A method of writing a pattern on the surface of a substrate by an electron beam is provided comprising exposing the substrate surface to an electron beam controlled to progressively describe the pattern by stepped movement of a focussed spot of the beam over the surface, and varying the exposure of the surface to the beam by selectably modulating the beam in the periods between successive movement steps to reduce the level of electron dose in predetermined positions of the beam spot on the surface.

30 Claims, 1 Drawing Sheet

METHOD OF AND MACHINE FOR PATTERN WRITING BY AN ELECTRON BEAM

CROSS REFERENCE TO RELATED APPLICATIONS

This application is a continuation of U.S. Ser. No. 09/463,449 filed Jan. 27, 2000 abandoned which is the national phase of PCT/EP98/04390 filed Jul. 15, 1998.

BACKGROUND OF THE INVENTION

A. Field of the Invention

The present invention relates to a method of and machine for writing a pattern the surface of a substrate by an electron beam.

B. Background of the Invention

The writing of patterns on substrates, for example circuits on wafers, by electron beam lithography is subject to closely controlled parameters to ensure accurate writing of pattern features in conjunction with a high throughput rate. The beam current downstream of a final focussing stage, i.e. probe current, is set in dependence on a number of factors, including accelerating voltage for producing the beam, beam spot size on the substrate surface, rate of step of the beam between successive writing positions during scanning of the substrate surface, i.e. dose clock or exel clock, sensitivity of an electron-sensitive resist on the surface, and correction needed for the proximity of features of the pattern. Proximity correction is required because the electron doses in adjoining areas can generate mutual influencing by the backscatter effect of secondary electrons and this leads to impairment of the writing accuracy. The doses need to be less in such areas and also in corner areas and inner areas of pattern shapes. Accordingly, constant alteration of dose has to be carried out during writing.

Various methods are at present employed for the purpose of changing dose. A first method is to vary the step rate or dose clock. This method has the disadvantage of reducing throughput, as part of the pattern then has to be written below the maximum rate. The maximum rate can otherwise be quite readily achieved by an electron beam machine equipped to provide a high density of the probe current. A second method is to change the probe current by altering one or more of the factors determining beam spot size or focus. This method, too, has the disadvantage of reducing throughput, due to the time taken to make the alteration. The alteration time may amount to several seconds and this time is lost whenever a dose change is required.

In W094/28574 there is disclosed a third method, which employs variation in electron dose level for particular pixels between 100 percent and two lesser values. Inner regions of a pattern are written with maximum dose and edge regions with a selectable one of the lesser doses, the dose variation being achieved by beam modulation under the control of blanking pulses of different widths. This method serves the purpose of defining the position of the edges of written patterns, in particular by displacing the edges relative to grid lines of a scanning raster, and is not concerned with dose control for any other corrective purpose. A similar method is disclosed in Murray et al, 'Experimental evaluation of an electron-beam pulse modulated blanker (160 MHz) for next-generation electron-beam raster scan systems' in Journal of Vacuum Science & Technology B, Vol. 13, No. 6 (November/December 1995), which describes use of three, rather than just two, sub-maximum dosage levels for writing pattern edges.

SUMMARY OF THE INVENTION

It is therefore the object of the invention to provide a method and a machine by which, in the course of pattern writing by an electron beam, dose rate may be varied as required for specific problematic parts of the pattern without loss in writing throughput time.

Other objects and advantages of the invention will be apparent from the following description.

According to a first aspect of the present invention there is provided a method of writing a pattern on the surface of a substrate by an electron beam, the method comprising the steps of exposing the substrate surface to an electron beam controlled to progressively describe the pattern by stepped movement of a focussed spot of the beam over the surface, and varying the exposure of the surface to the beam by selectably modulating the beam in the periods between successive movement steps to reduce the level of electron dose in predetermined positions of the beam spot on the surface, wherein said predetermined positions of the beam spot comprise positions associated with inner regions of feature shapes in the pattern, positions associated with pattern features of such proximity to one another as to be susceptible to mutual influencing during writing, and/or positions associated with linear pattern features liable to contain noise components when written, the writing of said linear pattern features by the modulated beam being repeated at least once to average the components.

The writing of the entire pattern is preferably carried out with a predetermined substantially constant rate of stepped movement of the beam spot, i.e. a substantially constant dose clock. This rate of movement is preferably the maximum rate still allowing sufficient exposure for writing of those features of the pattern requiring the highest level of dose. In that case, the beam modulation allows the dose level to be varied as required, so that the pattern can be written at the maximum step rate established by reference to the particular pattern shapes, the substrate resist sensitivity and the various beam parameters. No change in the step rate or other beam parameters is then necessary for the purpose of dose variation.

The predetermined positions of the beam spot where beam modulation is carried out are positions in which the dose level required for writing of the associated pattern parts is less than that required for the part requiring the highest level, namely positions associated with inner regions of feature shapes in the pattern, where a lesser dose is needed, and/or those associated with pattern features of such proximity to one another that mutual influencing, such as from backscattered secondary electrons, might occur during writing, and/or those associated with linear pattern features liable to contain noise components when written. In the last-mentioned case, the features can be written repeatedly by the modulated beam so as to average the noise components.

The beam modulation is preferably carried out substantially without change in the beam spot size or displacement of the beam spot during the writing. The modulation is preferably between maximum dose and zero dose, thus with complete blanking of the beam. This can be achieved by, for example, deflection of the beam to and from a blanking surface. The rate of stepped movement of the beam and the rate of modulation of the beam can be in any desired ratio, such as a ratio in which the dose is reduced by substantially one half by the beam modulation.

According to a second aspect of the invention there is provided an electron beam pattern writing machine for carrying out the method of the first aspect of the invention, the machine comprising beam generating and focussing means for generating an electron beam and focussing the beam as a spot of a substrate on which the pattern is to be written, control means for controlling the beam to progressively describe the pattern while moving the beam spot in steps over the substrate surface, and modulating means for selectably modulating the beam in the periods between successive movement steps to reduce the level of electron dose in predetermined positions of the beam spot on the surface, wherein said predetermined positions of the beam spot comprise positions associated with inner regions of feature shapes in the pattern, positions associated with pattern features of such proximity to one another as to be susceptible to mutual influencing during writing, and/or positions associated with linear pattern features liable to contain noise components when written, the writing of said linear pattern features by the modulated beam being repeated at least once to average the components.

The modulating means preferably comprises electrostatic deflecting elements extending parallelly to the beam, the elements being actuable by, for example, bipolar switching amplifier means. When the stepped movement of the beam spot is controlled by the control means to be at a substantially constant rate; the rise and fall times of the amplifier means are preferably less than that rate.

BRIEF DESCRIPTION OF THE DRAWINGS

An example of the method and embodiment of the machine according to the invention will now be described in more detail with reference to the accompanying drawings, in which.

DETAILED DESCRIPTION OF PREFERRED EMBODIMENTS

Figure 1:
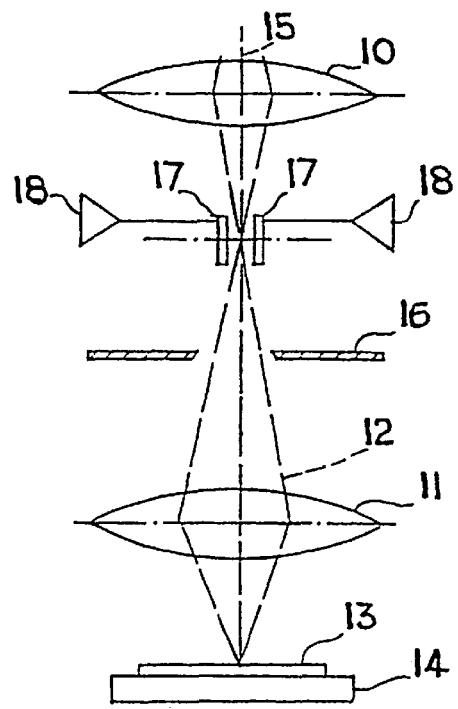
FIG. 1 is a diagram illustrating end stages of an electron beam lithography machine embodying the invention and showing an unblanked electron beam effective for writing on a substrate surface.

Referring now to the drawings, there is shown in schematic representation the lower part of an electron beam column of an electron beam lithography machine for writing patterns on substrates, for example electronic circuits on wafers coated with electron-sensitive resists. Such a circuit pattern can be fractured into fields containing individual parts of the pattern and the fields, in turn, into sub-fields. The pattern parts generally have the form of lines and solid shapes and are written by focussing the beam to define a spot on the resist-coated surface of a substrate and displacing the beam, in particular the spot, in steps to scan successive individual areas of the surface in correspondence with the shapes present in successive sub-fields of the pattern. The scanning can be performed on a raster basis, but preferably is vectored to follow the shapes. The beam is completely cut-off or blanked at any point where no pattern shape is present, such blanking being minimised with vectored scanning. The substrate itself is periodically displaced to dispose successive fields in a predetermined scanning zone of the beam.

Figure 2:
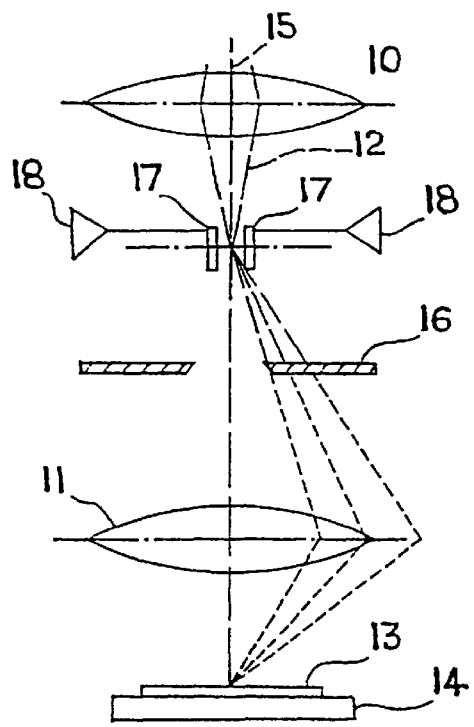
FIG. 2 is a diagram similar to FIG. 1, but showing the beam in a blanked state.

A writing procedure of this kind is well-known and FIGS. 1 and 2 show the final focussing stage of an electron beam column, namely two lenses 10 and 11 which are part of a series of three lenses serving to focus a deflectable electron beam 12 on the resist-coated top surface of a substrate 13 removably mounted in a substrate holder 14 on a displaceable stage (not illustrated). The axis of the column and thus of the beam in an undeflected state is denoted by 15.

As already explained, different levels of electron dose may be needed at different exels in the pattern. The dose variation can be applied, for example, to avoid writing errors otherwise arising from electron backscatter effect at closely adjacent pattern features, such as in the inner regions of a pattern shape. To achieve this variation, the machine embodying the invention has a blanking element 16 with a knife-edge aperture bounding the beam path and two electrostatic deflecting plates 17 extending parallelly to the beam axis 15 and controlled to deflect the beam across the blanking element 16 so that, as indicated by FIG. 2, the beam action on the substrate surface is interrupted. The deflecting plates are preferably positioned in the plane of the image of the upper lens 10, so as to allow conjugate blanking in which the beam spot maintains a stationary position on the substrate surface during beam deflection to and from the blanking element 16.

The control of the deflecting plates 17 to deflect the beam is carried out, in the case of a method exemplifying the present invention, in such a manner as to selectably modulate the beam in periods between successive steps, that is to say the modulation is enabled in predetermined positions of the beam spot on the substrate surface so that the spot dwell time and thus electron action on the resist coating is reduced. Each deflecting plate 17 is controlled by a respective fast bipolar switching amplifier 18 having rise and fall times significantly less than the rate of step, i.e. the dose clock rate, of the beam spot from one writing position to the next. In the case of a 100 megahertz dose clock, these times are preferably less than 200 picoseconds. The rise/fall time specification can be relaxed, however, if conjugate blanking as described above is employed. In that case, the susceptibility of the beam spot to jitter is lessened or removed. The jitter is normally very small, for example 2 nanometers for a 100 nanometer step in the beam spot at a dose clock of 100 megahertz.

The beam modulation carried out under the control of the amplifiers 18 is preferably such as to cut off or blank the beam completely, so that the probe current is reduced to zero. In the case of a 50% duty cycle performed at the applicable dose clock rate, the probe current is halved. Total blanking can be achieved by, for example, +/−20 volt amplifiers operating under conditions in which the accelerating voltage for beam generation is 20 to 50 kilovolts, the probe current is 10 picoamps to 100 nanoamps and the aperture of the final lens 11 is 200 to 600 micrometers. In the example of a 100 megahertz dose clock, each amplifier is modulated at the same rate of 100 megahertz to provide 5 nanoseconds of blanked beam and 5 nanoseconds of unblanked beam. Other ratios of beam modulation are possible in the case of lower dose clock rates, for example 3:1 at 67 megahertz and 4:1 at 50 megahertz.

The blanking voltage for beam cut-off by the knife edge of the blanking element 16 does not have a sharply defined value. The blanking voltage/probe current characteristic is S-shaped and varies in dependence on the accelerating voltage, initial beam current, final lens aperture, field deflection and other parameters, the greatest variation being about +/−1 volt to +/−19 volts.

The beam spot positions in which beam modulation is to be applied during pattern writing can be established at the time of setting up a software control governing the beam deflection for scanning the substrate surface areas in correspondence with the shapes in the pattern sub-fields. The modulation produced by the beam blanking is distinct from any blanking applied for beam spot movement over non-writing areas, such as between distinct shapes and between successive sub-fields and fields. The dose control by beam modulation can allow the entire pattern to be written at maximum dose clock rate, thereby increasing writing throughput time.

What is claimed is:

1. A method of writing a pattern on the surface of a substrate by an electron beam, the method comprising the steps of:
   exposing the substrate surface to an electron beam controlled to progressively describe the pattern by stepped movement of a focussed spot of the beam over the surface;
   varying the exposure of the surface to the beam by selectably modulating the beam in the periods between successive movement steps to reduce the level of electron dose in predetermined positions of the beam spot on the surface; and
   blanking said electron beam, said blanking including displacing said beam from said focussed spot,
   wherein the beam spot size is kept substantially constant while displacing said beam from said focussed spot.

2. A method according to claim 1, wherein the stepped movement of the beam spot is carried out at a predetermined substantially constant rate.

3. A method according to claim 2, wherein the rate of stepped movement is the maximum rate still allowing sufficient exposure for writing those features of the pattern requiring the highest dose level.

4. A method according to claim 1, wherein said predetermined positions of the beam spot comprise positions in which the dose level required for writing of the associated parts of the pattern is less than that required to write the part requiring the highest dose level.

5. A method according to claim 1, wherein said predetermined positions of the beam spot comprise positions associated with inner regions of feature shapes in the pattern.

6. A method according to claim 1, wherein said predetermined positions of the beam spot comprise positions associated with pattern features of such proximity to one another as to be susceptible to mutual influencing during writing.

7. A method according to claim 1, wherein said predetermined positions of the beam spot comprise positions associated with linear pattern features liable to contain noise components when written, the writing of said features by the modulated beam being repeated at least once to average the components.

8. A method according to claim 1, wherein the modulation of the beam is carried out substantially without displacement of the beam spot on the surface.

9. A method according to claim 1, wherein the modulation of the beam is between maximum dose level and zero dose level.

10. A method according to claim 9, wherein the modulation of the beam is carried out by deflection thereof to and from a blanking surface.

11. A method according to claim 1, wherein the rate of stepped movement and rate of modulation of the beam are in such ratio that the dose level in said predetermined positions of the beam spot is reduced by substantially one half.

12. An electron beam pattern-writing machine for carrying out the method according to claim 1, comprising:
   beam generating and focussing means for generating an electron beam and focussing the beam as a spot on a surface of a substrate on which the pattern is to be written;
   control means for controlling the beam to progressively describe the pattern while moving the beam spot in steps over the substrate surface; and
   modulating means for selectably modulating the beam in the periods between successive movement steps to reduce the level of electron dose in predetermined positions of the beam spot on the surface, said modulating means including electrostatic deflecting elements extending in parallel to the axis of the beam and positioned in a conjugate plane of said focussing means.

13. A machine according to claim 12, wherein the modulating means is operable to modulate the beam between maximum dose level and zero dose level.

14. A machine according to claim 12, wherein the modulating means is operable to modulate the beam by deflection thereof to and from a blanking surface.

15. A machine according to claim 12, wherein the modulating means comprises bipolar switching amplifier means for actuating the deflecting elements.

16. A machine according to claim 15, wherein the control means is operable to cause the stepped movement of the beam spot to be carried out at a substantially constant rate, the rise and fall times of the amplifier means being less than that rate.

17. A method of writing a pattern on the surface of a substrate by an electron beam, the method comprising the steps of:
   exposing the substrate surface to an electron beam controlled to progressively describe the pattern by stepped movement of a focussed spot of the beam over the surface;
   varying the exposure of the surface to the beam by selectably modulating the beam in the periods between successive movement steps to reduce the level of electron dose in predetermined positions of the beam spot on the surface; and
   blanking said electron beam, said blanking including displacing said beam from said focussed spot,
   wherein said predetermined positions of the beam spot comprise at least one of:
      positions associated with inner regions of feature shapes in the pattern;
      positions associated with pattern features of such proximity to one another as to be susceptible to mutual influencing during writing; and
      positions associated with linear pattern features liable to contain noise components when written, the writing of said linear pattern features by the modulated beam being repeated at least once to average the components, and
   wherein the beam spot size is kept substantially constant while displacing said beam from said focussed spot.

18. A method according to claim 17, wherein the stepped movement of the beam spot is carried out at a predetermined substantially constant rate.

19. A method according to claim 18, wherein the rate of stepped movement is the maximum rate still allowing sufficient exposure for writing those features of the pattern requiring the highest dose level.

20. A method according to claim 17, wherein the modulation of the beam is carried out substantially without displacement of the beam spot on the surface.

21. A method according to claim 17, wherein the modulation of the beam is between maximum dose level and zero dose level.

22. A method according to claim 21, wherein the modulation of the beam is carried out by deflection thereof to and from a blanking surface.

23. A method according to claim 17, wherein the rate of stepped movement and rate of modulation of the beam are in such ratio that the dose level in said predetermined positions of the beam spot is reduced by substantially one half.

24. An electron beam pattern-writing machine, comprising:
- a beam generator for exposing a substrate surface to an electron beam controlled to progressively describe a pattern by stepped movement of a focussed spot of the beam over the surface; and
- a controller to vary the exposure of the substrate surface to the electron beam by selectably modulating the beam in the periods between successive movement steps to reduce the level of electron dose in predetermined positions of the beam spot on the surface, the controller including electrostatic deflecting elements positioned in a conjugate plane of a lens to allow conjugate blanking, wherein said predetermined positions of the beam spot comprise at least one of:
- positions associated with inner regions of feature shapes in the pattern;
- positions associated with pattern features of such proximity to one another as to be susceptible to mutual influencing during writing; and
- positions associated with linear pattern features liable to contain noise components when written, the writing of said linear pattern features by the modulated beam being repeated at least once to average the components.

25. A machine according to claim 24, wherein the controller is operable to modulate the beam between maximum dose level and zero dose level.

26. A machine according to claim 24, wherein the controller is operable to modulate the beam by deflection thereof to and from a blanking surface.

27. A machine according to claim 26, wherein the electrostatic deflecting elements extend in parallel to the axis of the beam.

28. A machine according to claim 27, wherein the controller further comprises a bipolar switching amplifier for actuating the deflecting elements.

29. A machine according to claim 28, wherein the controller is operable to cause the stepped movement of the beam spot to be carried out at a substantially constant rate, the rise and fall times of the amplifier being less than that rate.

30. An electron beam pattern-writing machine, comprising:
- a beam generator for exposing a substrate surface to an electron beam controlled to write a pattern by movement of a focussed spot of the electron beam over the substrate surface;
- a lens positioned within a beam path of the electron beam for focusing the electron beam;
- a deflector positioned in a conjugate plane of the lens and adjacent the beam path of the electron beam, the deflector being controllable so as to deflect the electron beam across a blanking element; and
- a controller configured to deflect the electron beam via the deflector, allowing changes to be made to the electron beam.

* * * * *